(12) United States Patent
Horn

(10) Patent No.: US 7,019,311 B1
(45) Date of Patent: Mar. 28, 2006

(54) LASER-BASED IRRADIATION APPARATUS AND METHODS FOR MONITORING THE DOSE-RATE RESPONSE OF SEMICONDUCTOR DEVICES

(75) Inventor: Kevin M. Horn, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 156 days.

(21) Appl. No.: 10/810,420

(22) Filed: Mar. 25, 2004

(51) Int. Cl.
*G01R 31/28* (2006.01)

(52) U.S. Cl. ............... 250/484.4; 324/765; 250/214 R

(58) Field of Classification Search ............... 324/765; 250/484.5, 214 R
See application file for complete search history.

(56) References Cited

U.S. PATENT DOCUMENTS

| | | | | |
|---|---|---|---|---|
| 5,406,072 A | * | 4/1995 | Taylor | 250/214.1 |
| 5,962,857 A | * | 10/1999 | McKeever et al. | 250/484.5 |
| 2004/0159803 A1 | * | 8/2004 | Akselrod et al. | 250/581 |

OTHER PUBLICATIONS

Pease, IEEE Transactions on Nuclear Science, vol. 49, No. 6, Dec. 2002, 3163-3170.
Pershenkov, IEEE Transactions on Nuclear Science, vol. 48, No. 6, Dec. 2001, 2164-2169.
Karmarkar, IEEE Transactions on Nuclear Science, vol. 48, No. 6, Dec. 2001, 2158-2163.
Skorobogatov, IEEE Transactions on Nuclear Science, vol. 47, No. 6, Dec. 2000, 2442-2446.
Laird, Preprint submitted to Elsevier Preprint, Sep. 8, 2000.
Kalinushkin, Review of Scientific Instruments, vol. 70, No. 11, Nov. 1999, 4331-4343.
Hertel, Proceedings of SPIE vol. 4088 (2000) 17-24.
Melinger, Journal of Applied Physics, vol. 84, No. 2, Jul. 15, 1998, 690-703.
Demidov, Proceedings of Fifth Workshop on Electronics for LHC Experiments, Sep. 20-24, 1999, 547-550.
Johnston, IEEE Transactions on Nuclear Science, vol. 42, No. 6, Dec. 1995, 1650-1659.

(Continued)

*Primary Examiner*—David Porta
(74) *Attorney, Agent, or Firm*—Kevin W. Bieg

(57) ABSTRACT

A scanned, pulsed, focused laser irradiation apparatus can measure and image the photocurrent collection resulting from a dose-rate equivalent exposure to infrared laser light across an entire silicon die. Comparisons of dose-rate response images or time-delay images from before, during, and after accelerated aging of a device, or from periodic sampling of devices from fielded operational systems allows precise identification of those specific age-affected circuit structures within a device that merit further quantitative analysis with targeted materials or electrical testing techniques. Another embodiment of the invention comprises a broad-beam, dose rate-equivalent exposure apparatus. The broad-beam laser irradiation apparatus can determine if aging has affected the device's overall functionality. This embodiment can be combined with the synchronized introduction of external electrical transients into a device under test to simulate the electrical effects of the surrounding circuitry's response to a radiation exposure.

20 Claims, 12 Drawing Sheets

OTHER PUBLICATIONS

Carstensen, Mat. Science Res. Forum, vol. 173-174, (1994), p. 159.
Buchner, IEEE Transactions on Nuclear Science, vol. 41, No. 6, Dec. 1994, 2195-2202.
Johnston, IEEE Transactions on Nuclear Science, vol. 40, No. 6, Dec. 1993, 1694-1702.
Buchner, IEEE Transacations on Nuclear Science, vol. 35, No. 6, Dec. 1988, 1517-1522.
Buchner, IEEE Transactions on Nuclear Science, vol. 49, No. 3, Jun. 2002, 1502-1508.
Chugg, IEEE Transactions on Nuclear Science, vol. 49, No. 6, Dec. 2002, 2969-2976.

* cited by examiner

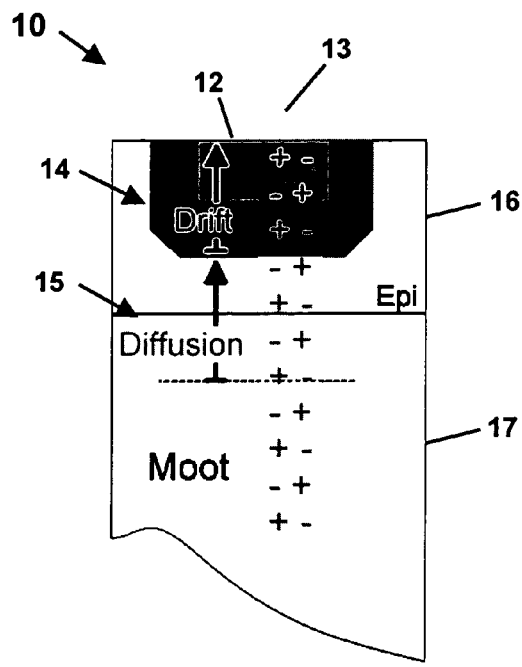
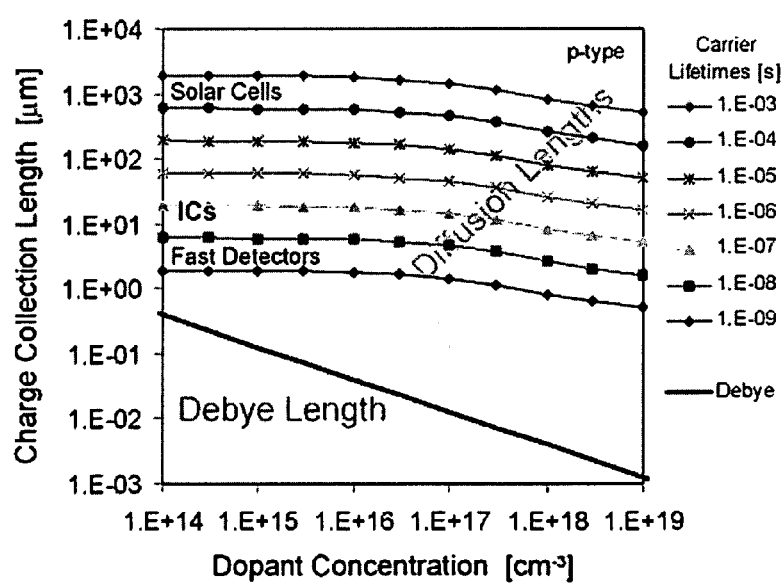

LASER-BASED IRRADIATION APPARATUS AND METHODS FOR MONITORING THE DOSE-RATE RESPONSE OF SEMICONDUCTOR DEVICES

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to ionizing radiation effects in semiconductor devices and, in particular, to a laser-based irradiation apparatus and methods to measure and image electrical charge collection in semiconductor devices in response to pulsed infrared laser irradiation.

BACKGROUND OF THE INVENTION

The effects of harsh radiation environments, such as are encountered in space, military, or nuclear power applications, are known to have deleterious effects on semiconductor devices and circuits. Recent studies have further shown that prolonged exposures to even low levels of radiation can degrade the performance of electronic devices. Compounding these effects, the continued reduction in feature size of modern commercial integrated circuits (ICs) can result in these devices becoming even more sensitive to transient ionizing radiation effects. Ionizing radiation produces electron-hole pairs (i.e., electrical charge) in semiconductor material that may be collected by potentially sensitive circuit nodes. The generation and collection of this unintended electrical charge within the circuit can alter the performance and reliability of specific circuit structures within the device.

It is particularly desirable to be able to measure and monitor changes in the electrical charge collection within a device to detect changes in its radiation response with age. Age-related changes in the radiation response of numerous types of semiconductor devices have been reported by several groups in recent years. See A. P. Karmarkar et al., "Aging and Baking Effects on the Radiation Hardness of MOS Capacitors," *IEEE Trans. Nucl. Sci.* 48(6), 2158 (2001); and V. S. Pershenkov et al., "Effect of Aging on Radiation Response of Bipolar Transistors," *IEEE Trans. Nucl. Sci.* 48(6), 2164 (2001). Studies of aging in ICs suggest that achieving a detailed understanding of some of the natural changes that occur in these devices over long storage times requires examination of the electrical and material properties of specific age-affected circuit structures within a die.

It is also important that the measurements be of comparable spatial resolution to the circuit structures comprising the device, and that the measurements be non-destructive to permit re-measurement of the same device at a later time to determine if aging effects have occurred in the device's charge collection response. Historically, the greatest obstacle to monitoring the radiation response of electronic devices used in long-lived electrical systems has been the destructive nature of most traditional radiation testing techniques. The accumulation of total dose damage with each subsequent re-test of a device can change its radiation response, (e.g. dose-rate, single event upset, single event latch-up, burn-out) independent of any other hidden aging effects. Moreover, existing radiation test techniques typically do not provide sufficient spatial information about the exact location of the radiation response changes within a die to permit targeted application of modern failure analysis techniques, such as are applied during the production phase of ICs. In particular, many of the high-sensitivity trace element analysis techniques most applicable to the analysis of aging effects (e.g., time-of-flight secondary ion mass spectroscopy and focused ion beam x-ray spectroscopy) can analyze regions only microns in diameter. Therefore, to enable the practical use of these targeted analytical techniques requires that specific circuit structures exhibiting aging effects be identified and located with micron-scale spatial resolution. Unfortunately, precise positional information can seldom by deduced from conventional broad-beam x-ray or electron beam radiation testing, or from broad-beam laser testing. Furthermore, conventional, non-destructive laser systems which employ beam-defining apertures to control the exposure area of the laser beam cannot produce usable beam spots much below tenths of millimeters in diameter. Particularly as IC circuit density increases and feature sizes decrease, apertured laser testing does not provide sufficiently detailed spatial information to directly identify individual age-affected circuit structures (e.g., diffused resistors, diodes, transistors and their component gates, drains and sources) with sufficient spatial accuracy to efficiently target state-of-the-art failure analysis techniques.

In most modern semiconductor devices, it is only the charge produced in the top few tens of microns of silicon that can be collected by the electrically active regions of the device; electron-hole pairs produced deeper in the silicon (i.e., in the heavily doped silicon beneath the epitaxial layer) recombine before reaching sensitive circuit nodes. Thus, while it is true that the exposure of a silicon device to severe gamma- or x-ray fluxes gives rise to electron-hole pair production throughout the entire silicon die (and package and circuit board and the entire system), the vast majority of this electrical charge has no path to directly affect the internal operation of the IC. If the charge is not produced within a diffusion length of the electrically active regions of the circuit, it will merely recombine, or be trapped, without perturbing the circuit.

A focused, milliwatt-watt infrared laser can produce as many electron-hole pairs in the electrically active regions of a silicon IC as are produced during severe radiation exposures of MeV gamma-rays or keV x-rays. The apparently huge difference in power between the laser and gamma- or x-ray exposure conditions is reconciled not when viewed in terms of how much energy the device is exposed to, but rather how much of that energy is actually deposited in the silicon device where it can affect the device's electrical operation. When viewed in this context, very few of the incident gamma- or x-rays actually produce electron-hole pairs within the silicon and even fewer of these electron-hole pairs are produced within the collection volume of the electrically active regions of the device. Therefore, infrared laser-based irradiation testing can produce dose-rate response in semiconductor devices that replicates the response to much more penetrating ionizing radiations.

Furthermore, laser-based probing can detect aging effects without the damage associated with particle beam or x-ray exposure techniques. Thus, dose-rate failure testing of ICs can be performed repeatedly, non-destructively, and inexpensively on a bench top. It is important to note that broad beams of energetic x-rays or electrons provide higher fidelity simulations of actual high-energy radiation environments than the infrared laser. Indeed, such exposures reproduce many bulk material radiation effects (e.g., shock, thermal effects, and secondary radiations) that the laser cannot. However, in the context of photocurrent collection and circuit electrical operation, the additional energy deposition deep in the sample only produces electron-hole pairs that may contribute to thermal and mechanical effects, but not to electrical behavior.

Among the most widely-used commercial lasers for laser-based radiation testing are Nd:YAG (Nd:YVO$_4$) lasers which operate at a wavelength of approximately 1064 nanometers with a corresponding penetration depth of approximately 300 microns in silicon. The laser-based irradiation apparatus of the present invention preferably uses 904-nm-wavelength laser light from a diode laser, having a penetration depth, or absorption length, of about 30 microns. As a consequence of this difference in penetration depth, the Nd:YAG laser requires much more power to achieve the same dose rate-equivalent charge density in the electrically active regions of the IC. This is because the electrically active regions of the IC are typically in the top 15 microns of the die. Thus, the 904-nm-wavelength laser light can achieve the same density of charge in the electrically active regions of the silicon (e.g., the top 15 microns) at a lower power than the Nd:YAG laser because the shorter wavelength light produces electrical charge only in the regions of the device from which it can be collected. This, in turn, allows the duty cycle of the laser's operation to be greater and allows for hundreds of thousands of laser shots to be performed during the collection of a scanned, micron-resolution image of the device's charge (i.e. photocurrent) collection. Additionally, the diode laser can be fired on-demand, rather than at a fixed repetition rate, which also facilitates its use in a scanned, data-collection mode. Finally, laser diodes that emit at other wavelengths, including 1064 nm, can used to create varying depths of penetration of the laser light and thereby enable the investigation of the depth dependence of a device's charge collection efficiency.

In a first embodiment of the present invention, a scanned, focused, infrared laser dose-rate equivalent exposure apparatus has been developed to measure and image the photocurrent collection across an entire silicon die. Due to its low power consumption and low heat generation, combined with its high duty cycle, ability to be focused without undue lens heating, and on-demand triggering, the focused laser irradiation apparatus permits the micron-scale imaging of the photocurrent collection (i.e., dose-rate response) across an entire IC die in a fully automated scan sequence. Comparisons of these dose-rate response images from before, during, and after accelerated aging of a device, or from periodic sampling of devices from fielded operational systems (such as avionic, nuclear power, or radiation facility electronics) allows precise identification of those specific age-affected circuit structures within a device that merit further quantitative analysis with targeted materials or electrical testing techniques. The high spatial resolution inherent in the focused laser irradiation apparatus directly indicates where such quantitative analysis techniques can be applied. By identifying the underlying physical cause of the device malfunction, it is then possible to determine the time-dependence of the overall effect, and predict the end-state of the dose-rate response in the aged device.

A second embodiment of the laser-based irradiation apparatus comprises a broad-beam, dose rate-equivalent exposure apparatus. Unlike the focused laser irradiation apparatus, which can identify specific circuit structures within the die that have changed with age, the broad-beam laser irradiation apparatus can determine if aging has affected the device's overall functionality. Additionally, for devices exposed to dynamically changing radiation environments, the broad-beam laser irradiation apparatus can replicate the time varying, dose-rate intensity of a space or hostile military environment. This embodiment can be combined with the synchronized introduction of external electrical transients into a device under test (DUT) to simulate the electrical effects of the surrounding circuitry's response to a radiation exposure.

SUMMARY OF THE INVENTION

The present invention is directed to a focused laser irradiation apparatus for imaging the dose-rate response of a semiconductor device, comprising a laser providing a beam of laser light of a wavelength, means for focusing the laser beam to a focal spot on the surface of the semiconductor device, means for scanning the focused laser beam at a plurality of spatial locations on the surface of the semiconductor device, means for pulsing the focused laser beam to provide a laser light pulse having a pulse width at each of the spatial locations on the surface of the semiconductor device to provide a charge collection signal at each of the spatial locations, and means for processing the charge collection signal from each of the spatial locations to provide a dose-rate response image of semiconductor device. Preferably, for silicon devices, the laser comprises an infrared laser diode that provides laser light with wavelength between 640 nm and 1064 nm, and more preferably with a wavelength of 904 nm; pulse width of between 10 nanoseconds and many seconds in duration; and a spot size of the focused laser beam less than about two microns in diameter. The focused laser irradiation apparatus can further comprising means for measuring the time delay between the laser light pulse and the charge collection signal at each spatial location to provide a time-delay image of the dose-rate response.

The invention further comprises a method for dose-rate response imaging of a semiconductor device, comprising exposing each spatial location of a plurality of spatial locations on the surface of the semiconductor device to a pulse of laser light from a focused laser beam to provide a negative (electron) charge collection signal and a positive (hole) charge collection signal at each spatial location, and processing the charge collection signals from each of the spatial locations to provide a dose-rate response image of the semiconductor device. The method can further comprise a method for time-delay imaging wherein the time delay of the charge collection signal from each of the spatial locations is measured to provide a time-delay image of the dose-rate response of the semiconductor device. A method for monitoring the aging of a semiconductor device comprises measuring and comparing the dose-rate response or time-delay images at different times.

The invention further comprises a method for dose-rate failure testing comprising exposing a semiconductor logic device to a broad-beam laser pulse having a programmatically controlled, modulated laser intensity and duration and measuring specific electrical parameters of the device during the exposure. The electrical parameter can be compared to a manufacturer-specified acceptable range to determine if the dose-rate-equivalent, modulated laser exposure caused functional failure of the semiconductor logic device. Successive application of the technique can then be used to determine the equivalent dose-rate dependence and pulse width dependence of the DUT. The method of dose-rate failure testing can further comprising injecting at least one electrical transient into a power or signal line of the semiconductor logic device during the laser-exposing step to represent the response of other, irradiated portions of the surrounding circuit components.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

FIG. 1A shows the mechanisms and length-scales for the collection of photocurrent in the electrically active region of a silicon device following an ionizing radiation exposure. FIG. 1B shows the Debye length and diffusive charge collection length as a function of dopant concentration for a range of carrier lifetimes in p-type silicon.

DETAILED DESCRIPTION OF THE INVENTION

Figure 2A:
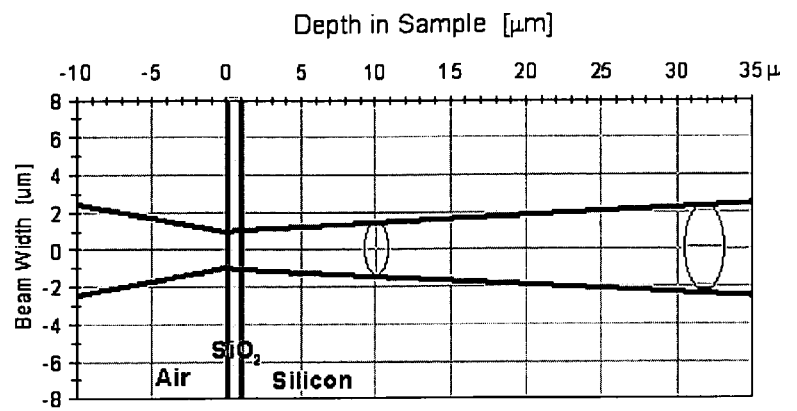
FIG. 2A shows the calculated beam width of a focused, 904-nm-wavelength laser beam incident on a 1-μm-thickness $SiO_2$-passivated Si substrate.

For use in radiation effects testing, infrared light can replicate the charge collection effects of far more penetrating ionizing radiations. This replication is possible, since only the charge produced in the first few tens of microns of silicon contributes to charge collection within the electrically active regions in most modern semiconductor devices. Electron-hole pairs produced deeper in the device by more penetrating radiations, such as x-rays, gamma-rays, or energetic electrons or ions, recombine before collection into circuit structures near the device surface, and therefore do not affect the normal electrical operation of the device. Consequently, the charge generated in the electrically active regions of the device by the deposition of the laser energy can be made comparable to the total charge generated in those same regions by far more penetrating radiation.

As shown in FIG. 1A, photocurrent collected in the electrically active region (e.g., a p-n junction) 12 of a semiconductor device 10 results from the generation of electron-hole pairs in the semiconductor material by an ionizing radiation exposure 13. Typically, the radiation exposure 13 will penetrate the device 10 to a depth well below the active region 12 and will generate electron-hole pairs (i.e., electrical charge) all along its path. The charge collected at the active region 12 is generally modeled as a combination of a prompt drift component 14 and a slower diffusive component 15. The prompt current results from charge collection by drift due to the local electric field in the depletion region of the device 10. The physical extent of prompt charge collection 14 around a field-free depletion region is characterized by a collection distance given by the Debye length. The Debye length is dependent upon the permittivity, temperature, and dopant concentrations within the depleted regions and is typically only a few microns, or less. The slower diffusive component of the charge collection is due to charge that must diffuse to the depletion region prior to being collected. The characteristic length of the slower diffusive component 15 is defined by the diffusion length, which is governed by the carrier lifetime, diffusion coefficient, and, implicitly, temperature and carrier mobility. Diffusive charge collection from beneath the epitaxial layer 16 is usually negligible, due to the dominant role of charge recombination resulting from the much higher dopant concentrations (and, therefore, far shorter carrier lifetimes) in the silicon substrate 17. Epilayer thickness is typically about 10 microns or less. Thus, while an actual penetrating radiation exposure 13 may produce charge throughout the entire depth of a silicon device 10, it is only that portion of the charge which is produced within the Debye length or diffusion length of an active circuit node 12 that is collected; charge produced at depths greater that these characteristic lengths undergoes recombination and makes little contribution to measured photocurrents.

In FIG. 1B is shown the charge collection length as a function of p-type dopant concentration for a variety of silicon junction devices. As expected, the Debye screening length decreases approximately as the inverse square root of the dopant concentration. The diffusion length is much longer than the Debye length, and strongly depends on the carrier lifetimes of the device. For most modern semiconductor logic devices, with dopant concentrations of $10^{15}$–$10^{18}$ atoms/cm$^3$ and minority carrier lifetimes of less than several hundred nanoseconds, typical diffusion lengths are less than approximately 15 microns. Such devices are aptly tested with the present invention. Devices with intentionally longer carrier lifetimes, such as photovoltaic solar cells, which are intended to collect as much charge as possible under light exposure, have charge collection lengths far in excess (e.g., 1000 microns) of the exposure depths of the lasers used in the present device.

Focused-Beam Laser Irradiation Apparatus

According to the first embodiment, a relatively low-power, focused infrared laser beam can be used to produce electron-hole pair concentrations, over a few square microns in the top tens of microns of the device, equivalent to that of an x-ray or LINAC exposure at much higher energy, as are typically used for radiation effects testing. The focused laser dose-rate response imaging apparatus can measure and image, with micron-scale resolution, the dose rate-equivalent, laser-generated photocurrent collection across an entire silicon integrated circuit die by stepping a device under test (DUT) beneath focusing optics.

In FIG. 2A is shown the calculated beam width of a focused, 904-nm-wavelength laser beam incident on a 1-μm-thickness SiO$_2$-passivated Si substrate. Light with a wavelength of 904 nm (i.e., 1.3 eV, slightly above the silicon band edge) has an absorption length of about 30 μm in silicon. The depth at which charge is generated can be changed by selecting a different wavelength laser diode. The narrow beam waist of the focused laser beam (i.e., roughly 2 microns spot diameter at the sample surface for 904 nm light) propagates with a slight divergence into the silicon.

Figure 2B:
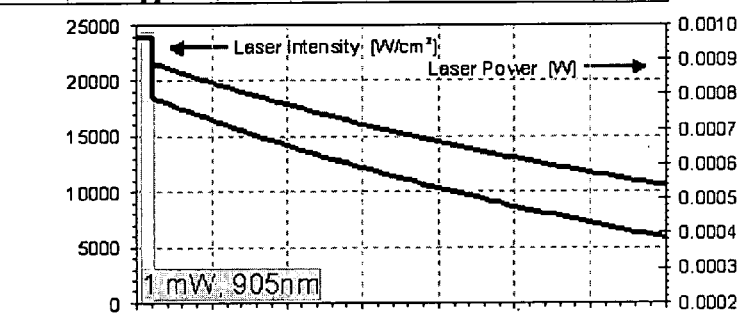
FIG. 2B shows the attenuation of the laser power and the decrease in laser intensity as a function of depth in the sample resulting from an exposure with a focused, 1 mW-delivered, 2-micron spot diameter, 50 ns wide, 904 nm laser pulse.

In FIG. 2B is shown the approximately exponential attenuation of the laser power of a focused, 1 mW-delivered, 2-micron diameter, 50 ns wide, 904 nm laser pulse as a function of depth in the sample (note the linear scale). The laser intensity at the surface is about $2.4 \times 10^4$ W/cm$^2$. The gradually increasing beam diameter with depth causes a further decrease in areal laser intensity as a function of depth.

Figure 2C:
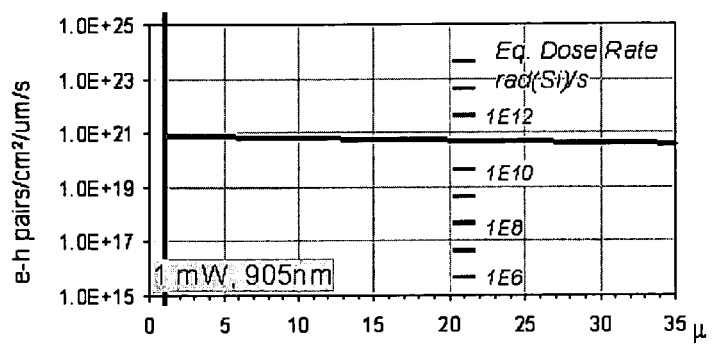
FIG. 2C shows the calculated electron-hole pair concentration in the top thirty-five microns of the $SiO_2$/Si structure from the focused laser exposure.

In FIG. 2C is shown the calculated electron-hole pair concentration in the top thirty-five microns of the SiO$_2$/Si structure resulting from the focused laser exposure (note the logarithm scale). The combined effects of the exponential attenuation of the laser power as the beam penetrates the silicon, and the areal effect of the slightly increasing beam diameter with depth, cause a decrease in charge density with depth. Also shown are the equivalent dose rates for a 10 MeV, 1 μs electron exposure, in rad(Si)/s. Since the range of electrons in silicon is very long, stopping-power calculations indicate a constant electron dose rate over this depth. As can be seen, the average electron-hole density created by the infrared laser deposition over the first few tens of microns in this silicon structure is comparable to a $10^{11}$ rad(Si)/sec electron irradiation. Of course, this equivalent charge density is produced only within the first tens of microns of silicon beneath the roughly 2-micron diameter laser beam spot. However, as described above, this surface region dominates the charge collection of the circuit.

Two main limitations exist in laser-based imaging: the presence of opaque metallizations in the circuit, and variations in surface reflectivity that reduce, but don't block, the charge generation beneath the laser beam spot.

Metallizations effectively shield the underlying circuit elements from the charge-generating laser beam. Except for a slight broadening of the beam beneath metal layers as it diffracts within the silicon, there is little remedy for this limitation. Nevertheless, sufficient information can be gleaned from unobstructed areas between close-lying metal lines to evaluate changes in circuit photocurrent collection with age. In the case of the broad-beam, modulated-intensity laser irradiation apparatus, shadowing effects can be minimized by using two laser beams incident to the device surface at orthogonal azimuthal angles relative to each other.

Non-uniform surface reflectivity is a slightly more insidious problem. However, surface reflectivity can be compensated for by measuring the backreflected portion of the incident light beam at each exposure point and re-normalizing the resulting charge measurement to the reduced light intensity actually delivered to the surface. Furthermore, for the purposes of monitoring changes in device radiation response with age, surface reflectivity is not a major concern since local differences in surface reflectivity will remain constant for each device from measurement to measurement and aging can be monitored as a relative change in photocurrent response with time.

Figure 3A:
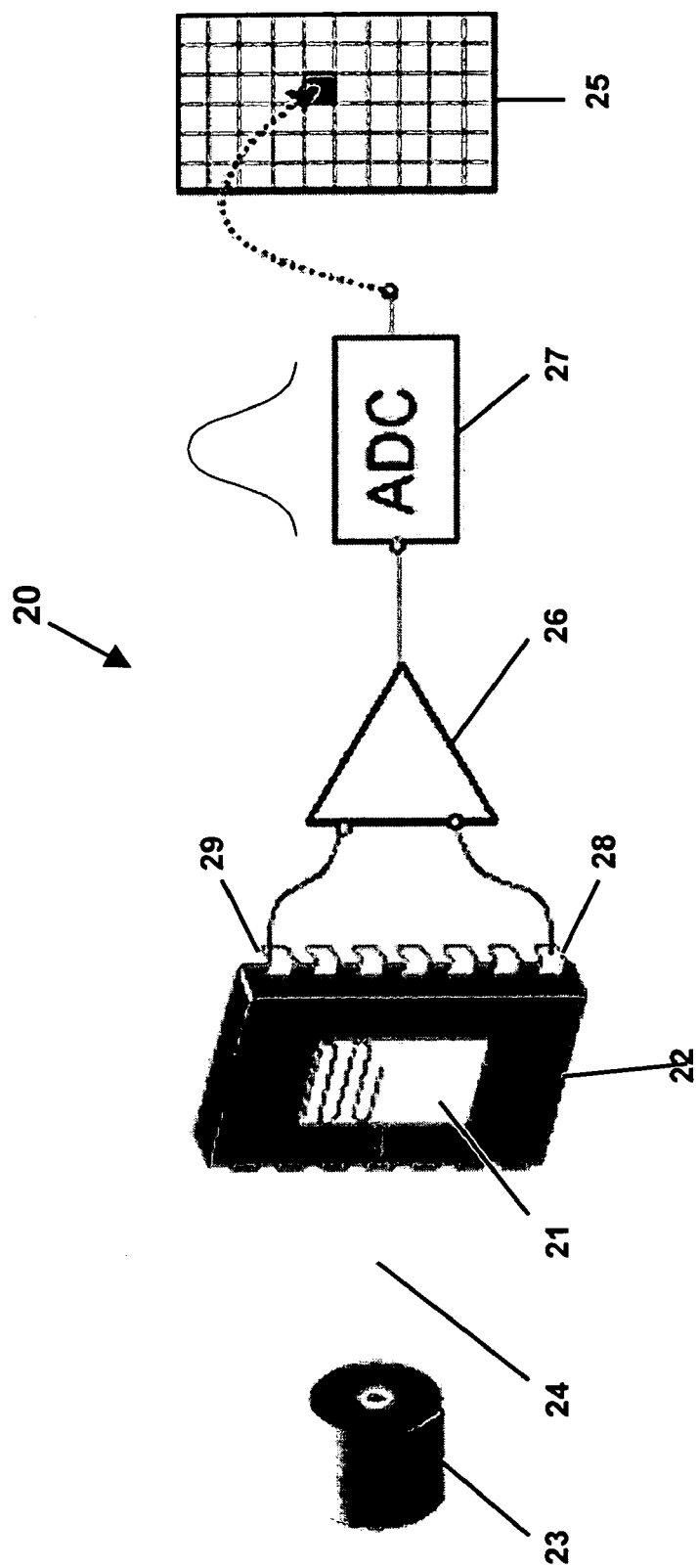
FIG. 3A shows a schematic illustration of a focused laser irradiation apparatus that can be used to image the photocurrent collected from individual circuit structures resulting from a focused-laser beam scan of the surface of a DUT.

In FIG. 3A is shown a schematic illustration of the focused laser irradiation apparatus 20 that can be used for imaging the photocurrent collection from a focused-beam laser scan 21 of the surface of a DUT 22. A laser 23 that is used to scan the DUT 22 provides laser light 24 having a wavelength of preferably 904 nanometers or less. More preferably, the laser comprises a pulsed infrared laser diode of 904 nm wavelength. Alternatively, using a laser 23 with wavelength in the range of 1064 to 640 nanometers, for example, provides the capability to probe the depth dependence of charge collection within the DUT 22. Laser pulse widths can be of selectable duration ranging from approximately 10 ns to many seconds. Minimum laser power should exceed that necessary to generate a measurable amount of charge collection and allow for losses due to light reflections from optical focusing elements and any material interfaces in the semiconductor device overlying active silicon regions of the circuit. For optimization of beam focus, a 3 mm aperture can be used to define the laser diode's emitted beam. A replaceable neutral density filter can be used to control the laser's delivered beam intensity. For example, an EG&G SG2002A, 2 W, 904-nm-wavelength GaAs laser diode provides ample output intensity in this configuration. Laser light emitted by the laser diode can be focused by means of a large working distance objective lens (e.g., a Bausch & Lomb 50×, 45 N.A. lens) to a micron-scale spot diameter on the surface of the DUT 22. A lower power objective lens can be used to perform lower resolution (e.g., 10 micron spot diameter) charge collection imaging, depending on the feature size of the DUT 22. The 2W laser diode can produce an equivalent dose rate of about $10^{11}$ rad(Si)/s in a 2 μm diameter spot over a depth of more than twenty microns in a silicon IC device.

The focused laser irradiation apparatus 20 further comprises a means for scanning the DUT 22 beneath the focused laser beam 24 and pulsing the laser at each of a plurality of spatial locations on the surface of the DUT 22. For example, the DUT 22 can be mounted in a fixture on a computer-controlled X-Y stage (not shown) with a minimum 0.5-μm-step size and 2" travel on each axis. The step size can be varied from 0.5 microns to tens or hundreds of microns be means of the control software; for 904-nm-wavelength laser light with a focused beam waist of approximately 2 microns, a step size of 2 microns is preferably used. The laser diode 23 can be oriented by a 5-axis positioner (not shown) to align the laser beam with the optical axis of the focusing optics. A 3-axis positioner can be used to make the surface of the DUT 22 normal to the incident focused laser beam 24. The DUT 22 can be scanned horizontally or vertically to produce a two-dimensional (2D) scan 21 of the surface.

The scanning means can comprise a computer to control the stepping and positioning of the X-Y stage on which the DUT is fixed. Data acquisition software can be used to calibrate the laser's charge generation in a fully depleted PIN diode (not shown) to that of the known charge generation produced in the same PIN diode by exposure to the characteristic energy alpha particles emitted by an Am-241 source placed directly on the PIN diode; this calibration can then be used to programmatically set the width and magnitude of the laser pulse to the appropriate values needed to achieve the desired equivalent dose-rate charge generation in the silicon. The data acquisition software can also be used to align the laser with the focusing optics by measuring line-scans of photocurrent collection from a PIN diode on which is affixed a transmission electron microscope (TEM) grid; the sharpness of the transition from the opaque TEM grid bars to the open 'holes' between the bars serves as a sensitive means to optimize the optical focusing path. The control software can be used to set the boundaries of the scan on the die and the step size of the scan.

The focused laser irradiation apparatus 20 further comprises a means for processing the charge collection signal from each of the plurality of spatial locations to provide a dose-rate response image 25 of the photocurrent collected by the DUT 22. A charge-sensitive preamplifier 26 and an analog-to-digital converter 27 can be used to measure and digitize the charge pulse collected from metallizations within the device (typically the ground or power lines 28 or 29 of the DUT 22) upon each laser pulse exposure, at each spatial location, of the 2D scan 21 of the DUT 22. A dose-rate response image 25 can then be produced in software by a control program.

After the software-based procedures for performing calibration, focusing and scan boundary-definition are completed, the control software can perform the measurement in an automated fashion in the following repeated sequence: (1) the control computer issues a trigger signal to a pulse generator which, in turn, sends an injection pulse to the laser diode of the appropriate pre-set magnitude and pulse width to achieve the pre-selected dose-rate equivalent charge production (the dwell time at each spatial location can be several milliseconds to enable the laser exposure and subsequent charge collection to occur), (2) the DUT is moved to the next (X,Y) spatial location of the scan (while the charge measurement electronics is processing the measured charge pulse from the DUT), (3) the numeric output of the charge measurement electronics is read by the computer, (this measurement consists of four channels: the electron charge collection from the power lines of the device, the hole charge collection from the ground lines of the device, the electron charge collection from a monitoring PIN diode along the optical path of the focused beam, and the time-delay between the laser trigger and the electron charge collection signal), and (4) the data is stored to disk and plotted to the computer screen. The charge measurement electronics comprises charge-sensitive pre-amplifiers whose inputs are connected to either the ground or power lines of the DUT, amplifiers whose input comes from the pre-amplifiers, and analog to digital converters whose analog inputs comes from the amplifiers and whose digital outputs are interfaced to the control computer. The digitized charge collection magnitudes can be converted to picoCoulombs, using an empirically determined charge calibration of the system electronics, to determine the total charge collected from each spatial location, or pixel. The resulting collection of measurements, made at each (X,Y) spatial location of the scan and stored to disk, can then be combined into a single dose rate response image of the photocurrent charge collection of the entire scanned region. This image contains the entire, micron-scale resolution, position-dependent, dose-rate response of the scanned region; software can be used to zoom in on any specific location to display the micron-resolved response at that location.

The focused laser irradiation apparatus 20 can be used generally to detect and locate imperfections, non-uniformities, or other material or structural anomalies that affect the transport of charge in a silicon device, and specifically to monitor aging effects in silicon IC devices. In particular, the focused laser irradiation apparatus can be used to measure and image, with micron-scale resolution, the photocurrent collection across an entire silicon integrated circuit die produced by dose-rate equivalent laser exposure, to image the time-delay of the dose-rate charge collection, to correlate the dose-rate response to biasing conditions, and to determine the uniformity of thin films overlaying the active regions of a silicon device.

Repeated application of these measurements can be used to non-destructively detect and locate structural and material changes within the die that alter the device's dose-rate response as it ages. A method for monitoring the aging of a semiconductor device comprises imaging the charge collected by the active regions of the semiconductor device at a first time and at a second time from the focused, pulsed laser exposure at each of a plurality of spatial locations on the surface of the semiconductor device. The dose-rate response images can then be compared to detect those spatial locations where the dose-rate response image has changed with time. These changed locations can then be further analyzed, for example using modeling and high resolution materials analysis techniques, to determine the physical cause of the local change in dose-rate response.

Dose-Rate Charge Collection Imaging of Semiconductor Devices

Figure 4:
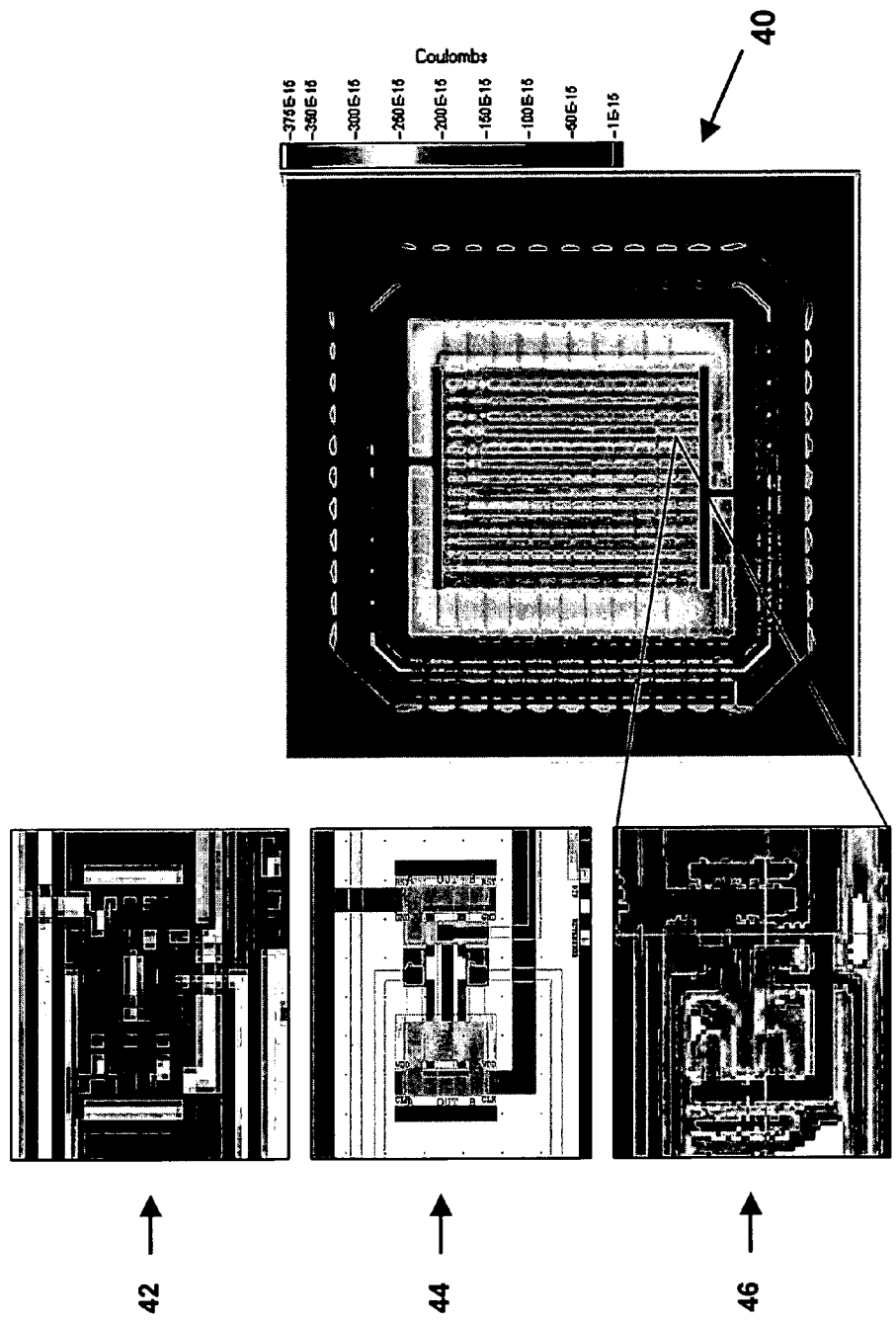
FIG. 4 shows a full-die dose-rate response image of a custom integrated circuit fabricated with a 0.5 μm, 3-level metal AMI process. Also shown are an optical photomicrograph, a circuit design mask, and an electron charge collection image of a single NAND gate within the body of the IC die.

In FIG. 4 is shown a full-die dose-rate response image 40 of a custom IC fabricated with a 0.5 μm, 3-level metal AMI process. The dose-rate response image 40 was produced by measuring the electrical charge collected from each of a plurality of spatial locations of the surface of a DUT during exposure to the scanned, focused, pulsed, 904-nm-wavelength infrared laser beam from the focused laser irradiation apparatus 20. The laser intensity and pulse width were selected to produce the same electron-hole pair concentration within the charge collection regions of the device as would be produced by a gamma ray or electron beam exposure of specified energy and intensity. Also shown in FIG. 4 are an optical photomicrograph 42, a circuit design mask 44, and an electron charge collection image 46 of a single NAND gate within the body of the IC die. The full die size is 3.2 mm×3.2 mm. The bright areas in the photomicrograph 42 (i.e., dark areas in the charge collection image 46) indicate the locations of metal surfaces and the dark areas (i.e., light areas in the charge collection image 46) indicate exposed silicon. The metallization lines on the die are 4.8 microns wide. The micron-resolution of the focused-beam imaging permits informed interpretation of the dose-rate response image to determine the circuit structure beneath thin metal overlayers. Furthermore, by comparing dose-rate response images from before, during, and after fielded and controlled-aging environments, changes in circuit response at the sub-transistor level can be detected, analyzed, and modeled using high resolution materials analysis of the aged structure. By understanding the underlying physical cause of the changes in the radiation response with storage time, device-specific predictive models can be developed to identify the end-state of aging devices, well in advance of reaching that state.

Dose-Rate Charge Collection Time-Delay Imaging

Whether a radiation exposure causes a semiconductor device to malfunction hinges on both how much electrical charge is collected and over how long a period of time it is collected. The aging effect on the magnitude of the electrical charge collected can be monitored as described previously. The focused laser irradiation apparatus 20 can also be used to measure the time-dependence of the local charge collection and to determine whether or not the temporal dependence of the radiation-induced photocurrent has changed with age. In this time-delay imaging method, the time between the triggering of the focused laser pulse and the peak of the collected charge is measured at each spatial location of a plurality of scanned spatial locations. For example, each spatial location in a micron-stepped X-Y scan area can be exposed to a laser pulse of a predetermined intensity and duration. The time delay between the firing of the laser and the peak of the ensuing charge pulse can be measured and recorded at each spatial location using a constant fraction discriminator (CFD) and time-to-amplitude converter (TAC). The CFD is a commercial analog circuit that detects the moment in time when a pulse delivered to its input reaches a user-selected, "constant fraction" of its ultimate full amplitude. Its purpose is to provide an amplitude-independent "time mark" of when an input pulse has arrived. The output pulse of the CFD serves as one of the two inputs into the TAC. The other input to the TAC is the original trigger signal that fires the laser. The TAC is a commercial analog circuit which converts the time-delay between two separate input pulses into a single output pulse whose amplitude corresponds to the time delay between the arrival of the input pulses; it issues a pulse of its own whose voltage amplitude is linearly proportional to the amount of time between the arrival of the peaks of the two input pulses. This time-delay data is calibrated to a known time-delay signal, after which it can then be rendered as a micron spatial-resolution, nanosecond time-delay-resolution image of the circuit. The time-delay resolution image reflects differences in prompt versus diffusive charge collection among the circuit structures and can be used to detect temporal changes in charge collection processes with aging.

Figure 5:
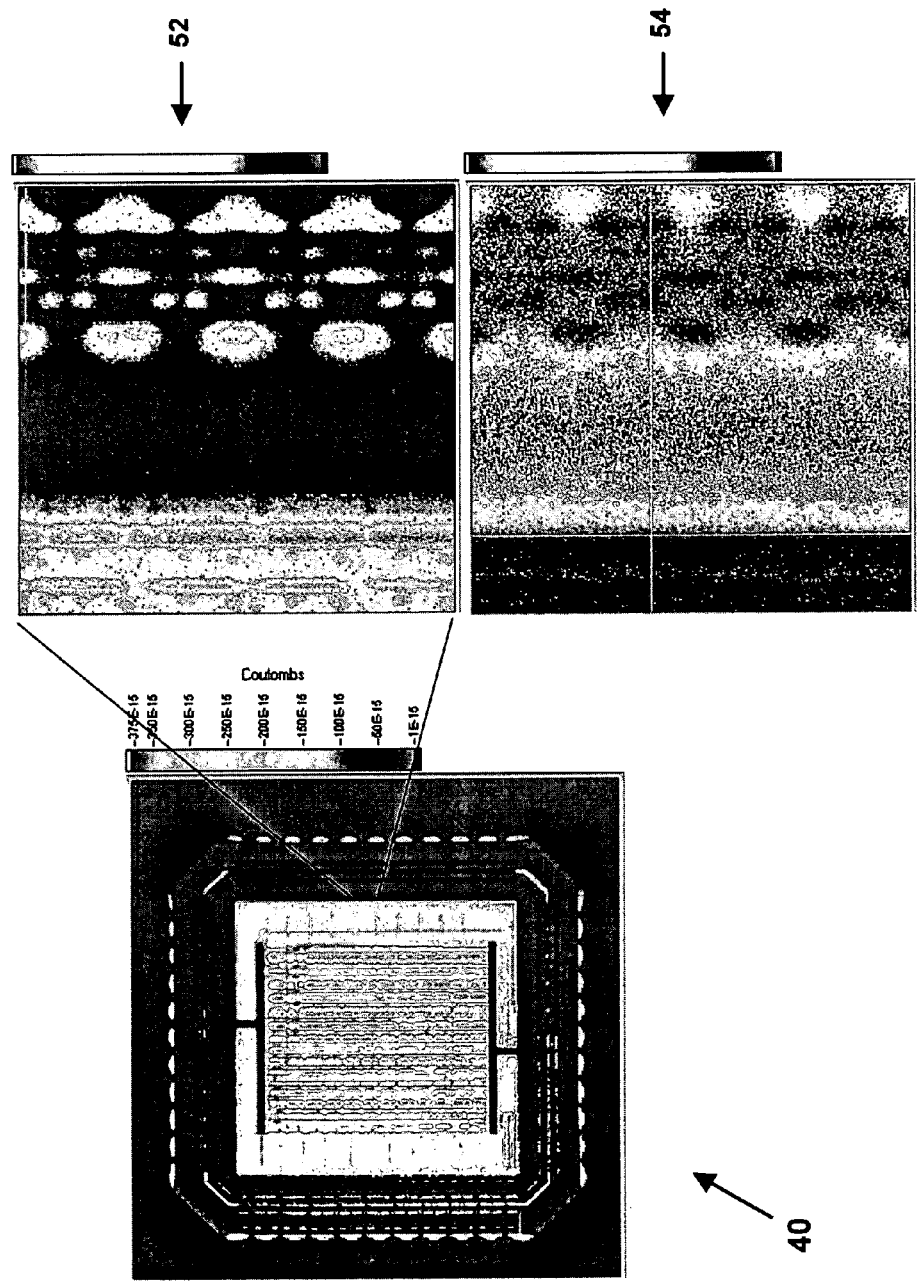
FIG. 5 the full-die dose-rate response image of the full die of the custom integrated circuit, and two high-resolution images, extracted from a 400×400 micron region of the full die image, depicting the total magnitude of the electron charge collection and the nanosecond-scale time-delay in the electron charge collection.

In FIG. 5 is shown the full-die dose-rate response image 40 of the custom IC described above; the typical imaging mode of the charge-delay imaging technique, described above, is electron charge collection. Also shown in FIG. 5 are an enlarged, high-resolution image 52 of the electron charge collection from a 400×400 micron region, extracted from the full die image and, in image 54, the nanosecond-scale time delay in the collection of that electron charge from the same region, as obtained using the dose-rate response imaging method. Images 52 and 54 appear complementary, in that bright regions in the electron charge collection image 52 appear as darker regions in the time-delay image 54 and vice-versa. This can be understood from the fact that regions of high charge collection typically correspond to depletion regions in the silicon circuit and are therefore collected via prompt (i.e., fast) charge collection processes. Thus, regions of high charge collection will typically correspond to fast (i.e., short time delay) collection. Conversely, darker regions in the electron charge collection image 52 correspond to lower magnitudes of charge collection that are typically collected from non-depleted silicon regions where diffusive (i.e., slower) charge collection dominates. Thus, these regions of lower relative charge collection will appear as brighter (i.e., longer time delays) in the nanosecond-scale time delay images 54. The time-delay-resolution image 54 indicates that the present invention can be used to measure the relative time delay in the collection of charge from different circuit structures within a device. Charge collection images comparable to image 52 can also be obtained from the collection of "holes" from the device's ground lines.

Correlations Between Dose-Rate Response and Biasing Conditions

Figure 6:
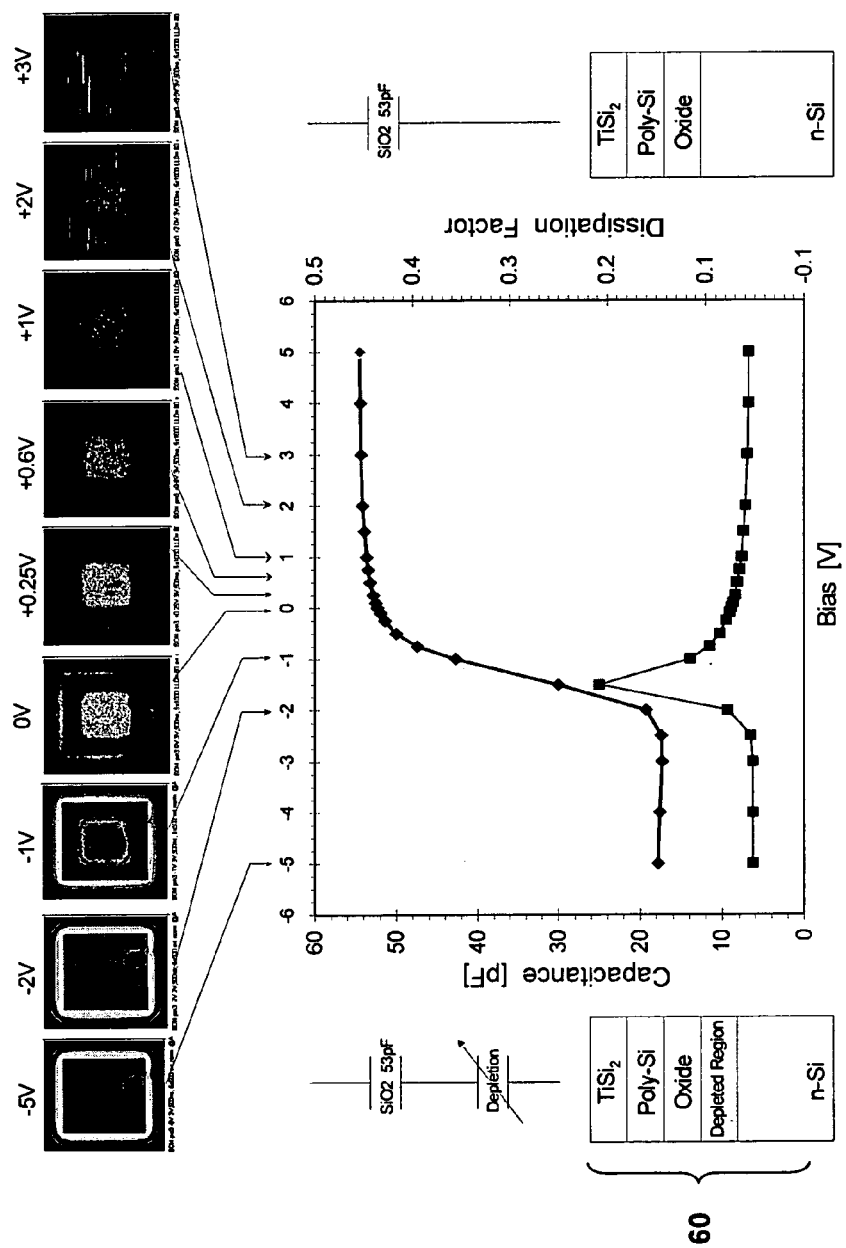
FIG. 6 shows a plot of the capacitance of the SOI structure when the bias is varied over a range of −5 to +5 V. Scanned, focused laser charge collection images of the position dependence to the capacitively coupled charge collection through the insulating dielectric are shown for the biases indicated.

The focused laser irradiation apparatus 20 can also be used to examine bias-dependent capacitively coupled charge transport across insulating oxide layers. In FIG. 6 is shown a plot of the capacitance of a SOI structure 60 when the bias is varied over a range of −5 to +5 V. The change in capacitance corresponds to the creation of a depletion region in the negatively biased condition. The capacitance measurements indicate that, under certain transient radiation conditions, significant charge transport within the underlying silicon substrate, under heavily inverted conditions, can give rise to substantial capacitively coupled charge collection in circuit structures above the buried oxide layer.

The position-dependence of the dose-rate response of the SOI structure 60 was determined by stepping the position of the capacitor beneath the low-power, focused, 904-nm-wavelength, pulsed laser beam. Each scanned location was exposed to a single 500 ns, $8 \times 10^8$ rad(Si)/s-equivalent laser pulse. The resulting electrical charge collected on the top $TiSi_2$ electrode was measured with a charge sensitive integrating amplifier, digitized, and stored along with its spatial location. The electrical capacitance measurements were made in parallel with the dose-rate measurements.

The upper laser dose-rate response images in FIG. 6 show the charge collection response of the capacitor structure. The dose-rate response images reflect the change in position-dependence of the charge collection of the SOI device as it goes from strong depletion at −5 V to strong accumulation at +5 V. At −5V, the substrate region underneath the buried oxide is depleted, leading to uniform charge collection in $TiSi_2$ electrode. The dose-rate response images indicate that the charge collection becomes spatially non-uniform at intermediate bias levels (−2V to +2V) and that the charge collection from the perimeter of the $TiSi_2$ electrode is significantly less than that in the center. At +5V, when the substrate is in accumulation, charge is no longer collected by the top electrode.

Thin Film Overlayer Thickness and Uniformity Diagnostic

The focused laser irradiation apparatus 20 can also be used to determine, in a nondestructive manner, if a deposited overlayer thin film is of uniform thickness and not perforated by pinholes. Light is normally unable to penetrate metal or metal alloy films. However, when the overlayer film is thin enough, (i.e., less than about 1000 Angstroms), the attenuation of the light is not complete and some fraction of the attenuated light penetrates into the electrically active silicon beneath the thin film and produces measurable charge. In doing so, the amount of charge generated and collected is a measure of how much light penetrated through the thin film—or alternatively stated, how thick the thin film is. The thickness of the film can be deduced from the equation that describes the attenuation of light normally incident on the material:

$$I(x)=I_o e^{-\alpha x}$$

where $I(x)$ is the intensity of the light at a depth x, $\alpha$ is the absorption coefficient of the material, and $I_o$ is the incident intensity of the light. The 1/e optical penetration depth is proportional to the reciprocal of the absorptivity, $1/\alpha$. Since the magnitude of collected charge can be directly related to the intensity of the incident light, and since the absorption coefficient is known for the material, the thickness of the thin film overlayer can be calculated. Other analytical techniques that are used for film thickness measurement (e.g., Rutherford Backscattering or Cross-sectional Transmission Electron Microscopy) are destructive to the electrical device. Therefore, the laser-based film-thickness measurement method of the present invention can detect and display variations in the thickness of the deposited thin film without damaging the underlying electrical device.

Figure 7:
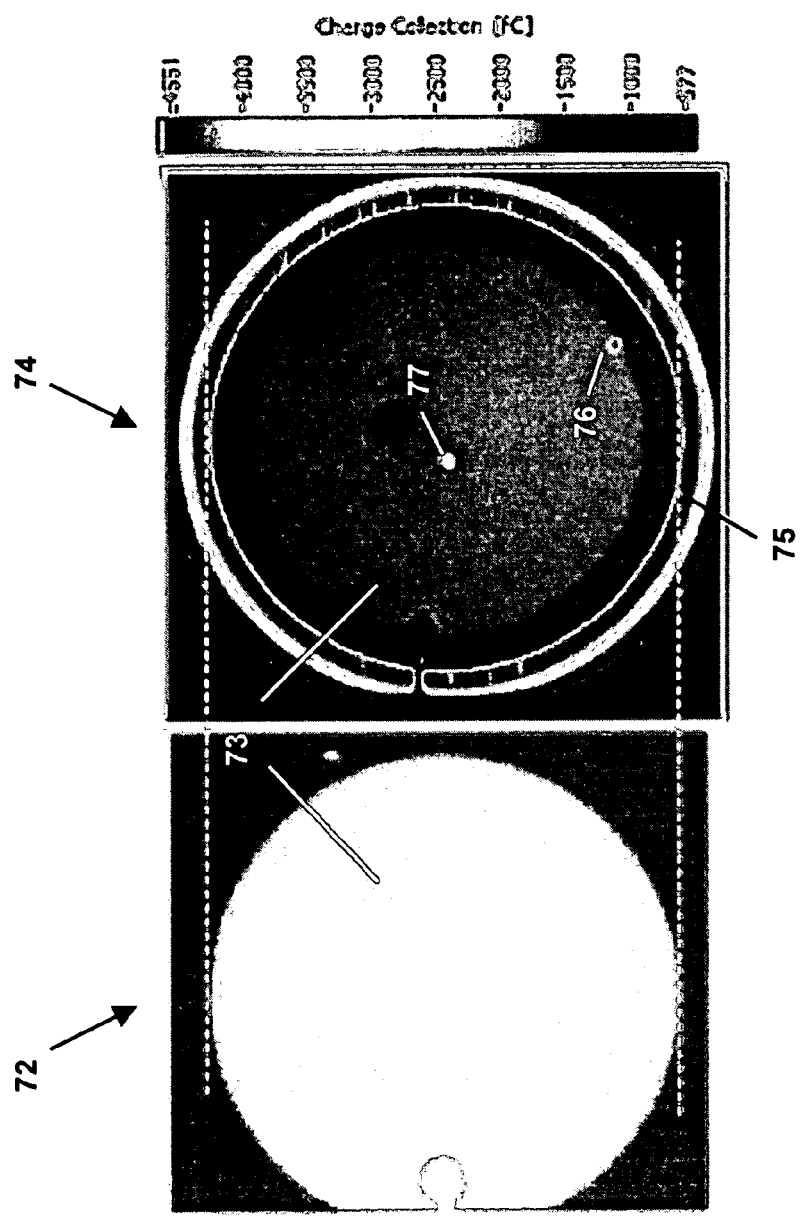
FIG. 7 shows an optical photomicrograph of a circular 470-μm-diameter, 1000 Angstroms thick $TiSi_2$ upper electrode of a silicon-on-insulator (SOI) capacitor. Also shown is a laser dose-rate image of the circular capacitor plate that shows non-uniformities in the thickness of the electrode metallization.

For example, the thickness of $TiSi_2$ metallizations used in modern IC fabrication processes is thin enough to allow a measurable amount of incident 904 nm light through the metal layer before total attenuation occurs. In FIG. 7 is shown an optical photomicrograph 72 of a circular 470-µm-diameter, 1000 Angstroms thick $TiSi_2$ upper electrode 73 of a silicon-on-insulator (SOI) capacitor. Also shown is a laser dose-rate image 74 that shows separate non-uniformities or inhomogeneities in the thickness of top electrode $TiSi_2$ metallization 73. The baseline charge collection from the unattenuated laser beam striking the exposed silicon of the SOI capacitor is seen as the bright ring 75 just outside the perimeter of the circular $TiSi_2$ metal electrode 73. A pinhole 76 is visible as a bright spot at the lower right quadrant of the circular metallization. The pinhole 76 is known to be a through-hole by the magnitude of the collected charge from the laser scan. Another thickness anomaly 77 is visible near the center of the circular capacitor plate. However, unlike the pinhole 76, the charge collection magnitude from the anomaly 77 is less than the unattenuated laser exposure, so the laser beam is necessarily being attenuated by some metal thickness before reaching the underlying silicon and producing charge.

Broad-Beam Laser Irradiation Apparatus

Another embodiment of the present invention comprises a broad-beam laser irradiation apparatus that can be used to measure the functional or operational failure of entire silicon integrated circuits and circuit fragments exposed to a broad area, dose-rate equivalent, laser exposure. For the purposes of detecting and tracking age-induced changes in circuit photocurrent response to ionizing radiation, electrical parametric measurements can be used in conjunction with laser dose-rate testing to compare changes in the overall circuit response during various stages of controlled aging. The devices being studied can be measured periodically during storage in their particular aging environments (e.g., thermal, gamma, neutron, hydrogen, plus combinations) to extract time-dependencies of the changes. Thus, in the broad-beam embodiment, the broad-beam laser irradiation apparatus can be used to test the functionality of an entire IC while embedded in a functioning circuit board or circuit board fragment. In contrast to the focused laser irradiation apparatus, which exposes and measures the response of individual microscopic circuit structures within an IC, the broad-beam laser irradiation apparatus tests the functional dose-rate response of the entire IC, or multiple ICs, within the circuit board.

Figure 3B:
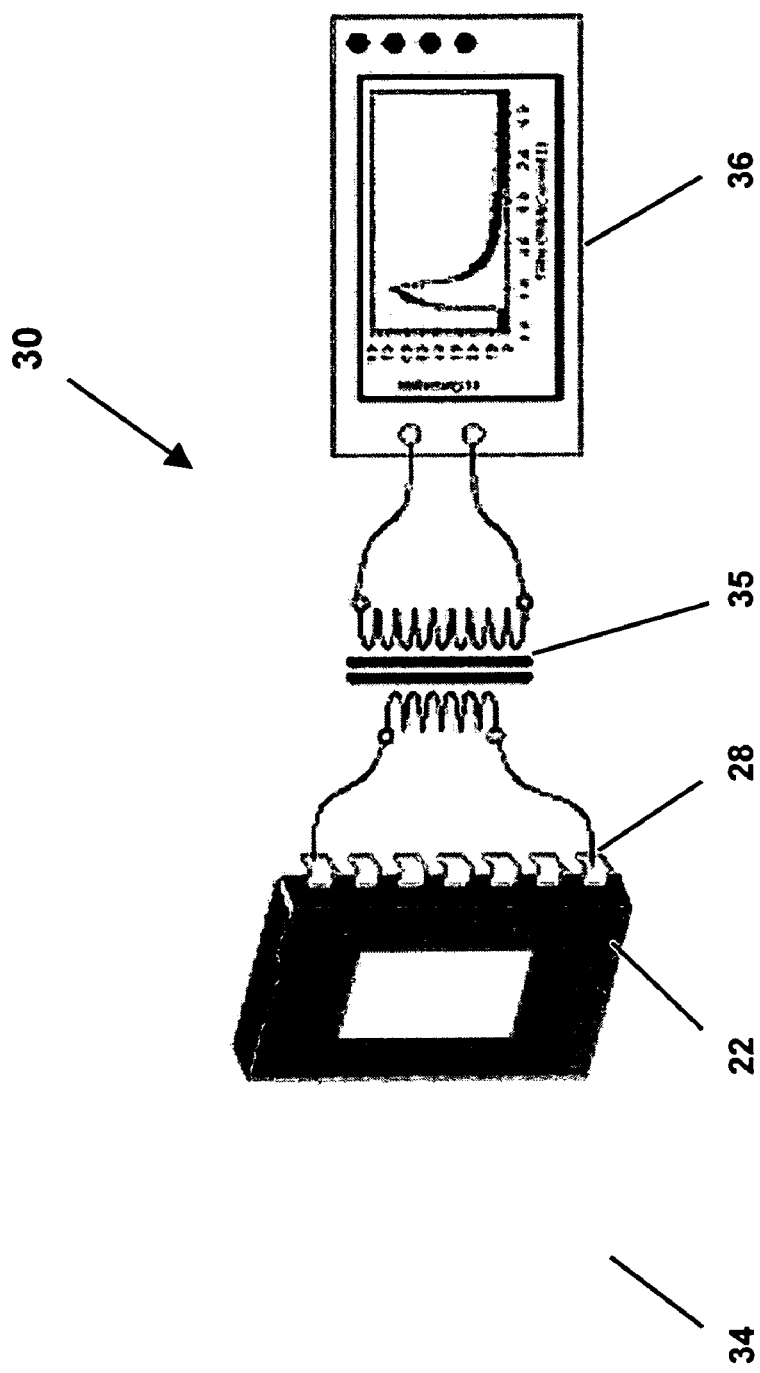
FIG. 3B shows a schematic illustration of a broad-beam laser irradiation apparatus that can be used to measure the dose-rate response of the entire DUT die.

In FIG. 3B is shown the broad-beam laser irradiation apparatus 30 of the present invention that can be used to measure the dose-rate response of a semiconductor DUT 22. With this broad-beam laser irradiation apparatus 30 the unfocused output 34 of one or more laser diodes can be used to irradiate the DUT 22. Other types of pulsed broad-beam laser sources can also be used. The charge collection signal can be measured with a current-viewing transformer 35, the output of which can be detected by a waveform digitizer 36. Other electrical signals from the irradiated DUT 22 can similarly be measured to detect changes in the circuit response.

The laser exposure can calibrated in this apparatus using a laser power radiometer which measures the energy deposition of a single laser pulse. The measurement resulting from the exposure can be either the total device photocurrent collection, or the change in a known device output (e.g. a logic level output fixed by external circuitry to be +5V or 0V), or other electrical signal from the circuit. The same control of laser pulse width and magnitude can be used in the broad-beam apparatus, as was previously described for the focused laser irradiation apparatus. The injection current of the laser diode arrays in this apparatus can be modulated to produce a time-varying, intensity-varying dose-rate equivalent laser exposure. This, in turn, can be used in conjunction with a pre-characterized, controlled, external, electrical transient on the power and ground lines of the DUT whose introduction is synchronized with the delivery of the laser pulse. This combination of stimuli to the DUT replicates the charge generation effects of the dose-rate exposure internal to the DUT and the electrical transients that the DUT experiences from the surrounding circuit's exposure to the radiation.

Dose-Rate Failure Testing

Figure 8:
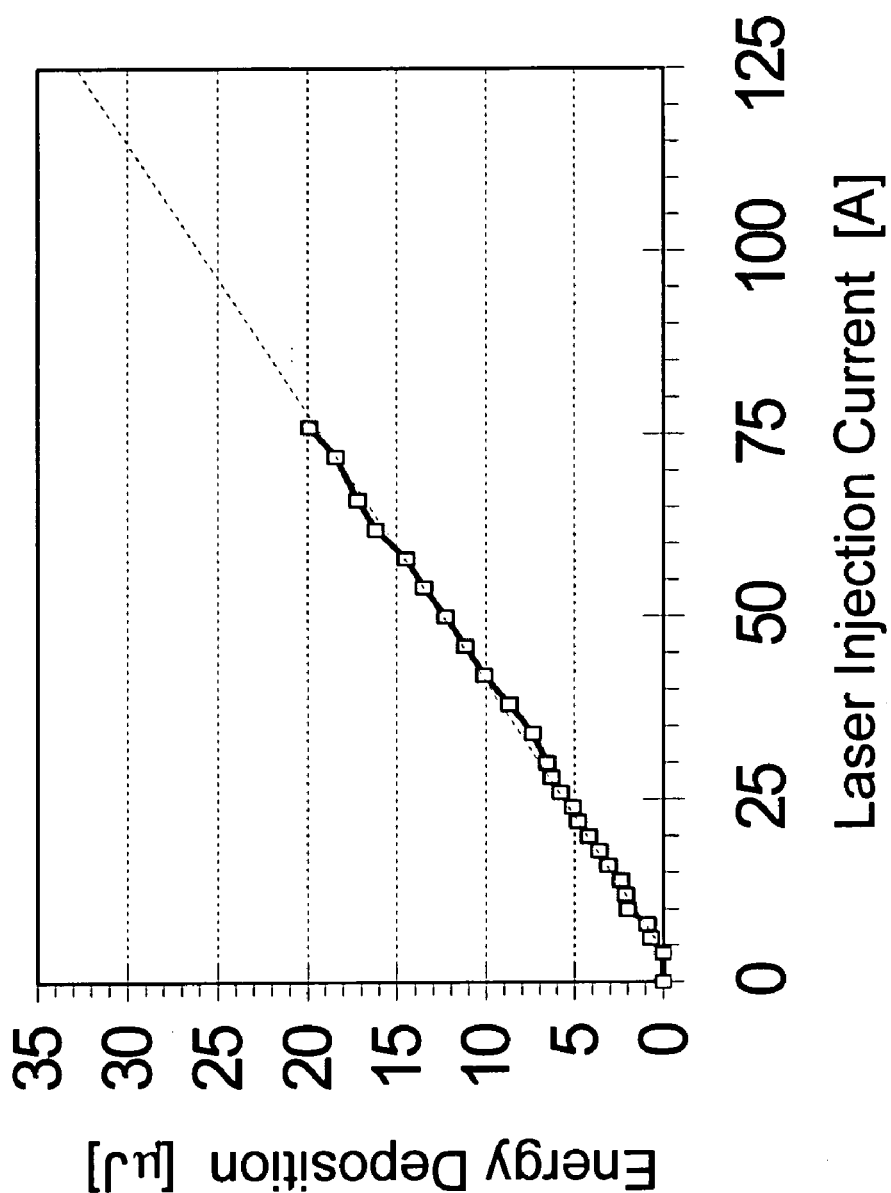
FIG. 8 shows the energy delivered to the DUT as a function of the current injected into the laser diode array of the broad-beam laser exposure apparatus.

The injection current into the laser diode array can be varied to change the dose-rate equivalent pulse intensity. Therefore, by controlling the energy deposition into the target over a controlled period of time, the effective dose-rate can be selected. As shown in FIG. 8, by increasing the injection current into the laser diode array, the energy deposition and therefore the equivalent dose-rate delivered to the DUT can be increased in a linear fashion.

Figure 9:
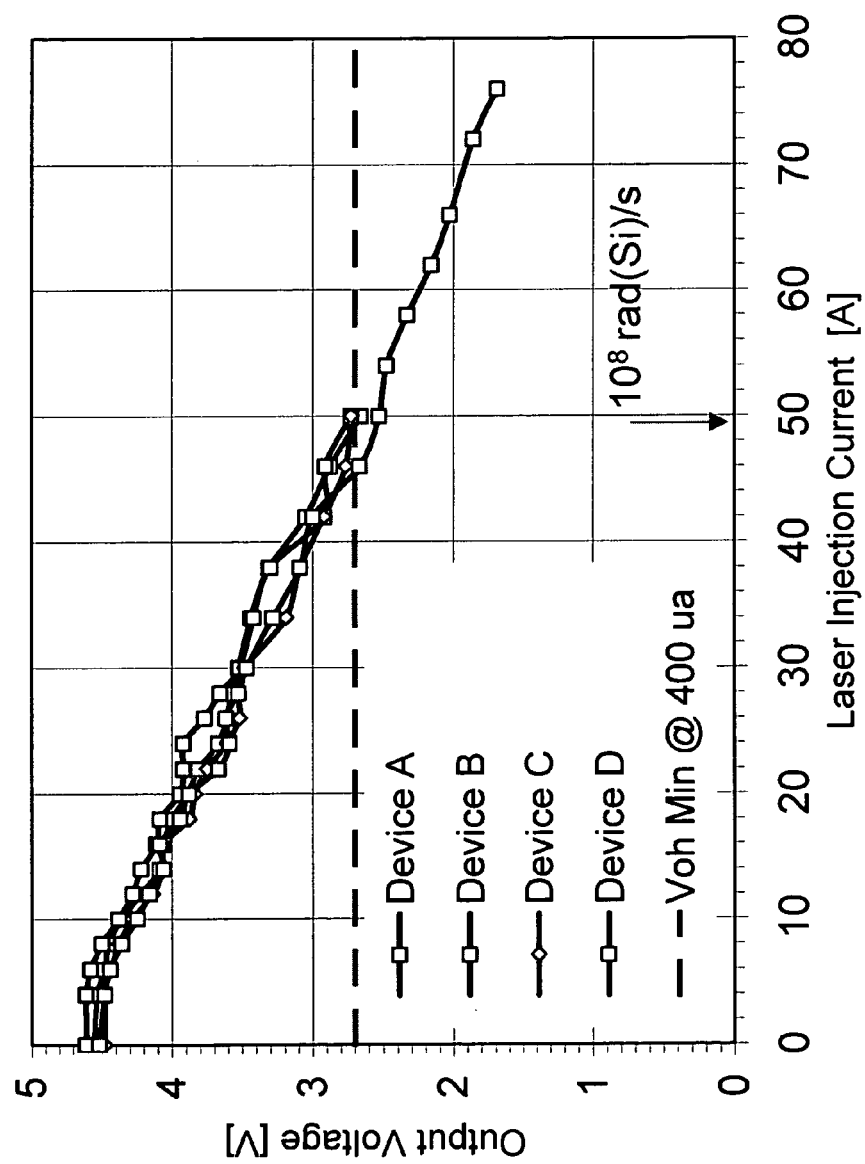
FIG. 9 shows broad-beam laser dose-rate logic failure test results for four different aged devices.

In FIG. 9 are shown results of a typical laser dose-rate logic failure test for four different logic inverted circuits (i.e., Devices A, B, C, and D). Failure in the devices is seen to occur when the minimum inverter output voltage falls below the manufacturer-specified value of $V_{oh}$=2.7V at 400 µA. In this example, the failure is determined to be caused by a total energy deposition of about 12 µJ, corresponding to an equivalent dose-rate of about $10^8$ rad(Si)/s.

Time Duration Examination

The broad-beam laser irradiation apparatus 30 can also be used to control the time-duration of the incident radiation pulse from nanoseconds to DC exposures. This time-duration feature can be used to examine the dependence of a device's failure on the radiation pulse width. Both the intensity and the duration of the dose-rate equivalent pulse can be varied. The width of the radiation pulse can be controlled by the width of the injection current pulse which, in turn, can be controlled programmatically by the laser system computer.

Figure 10:
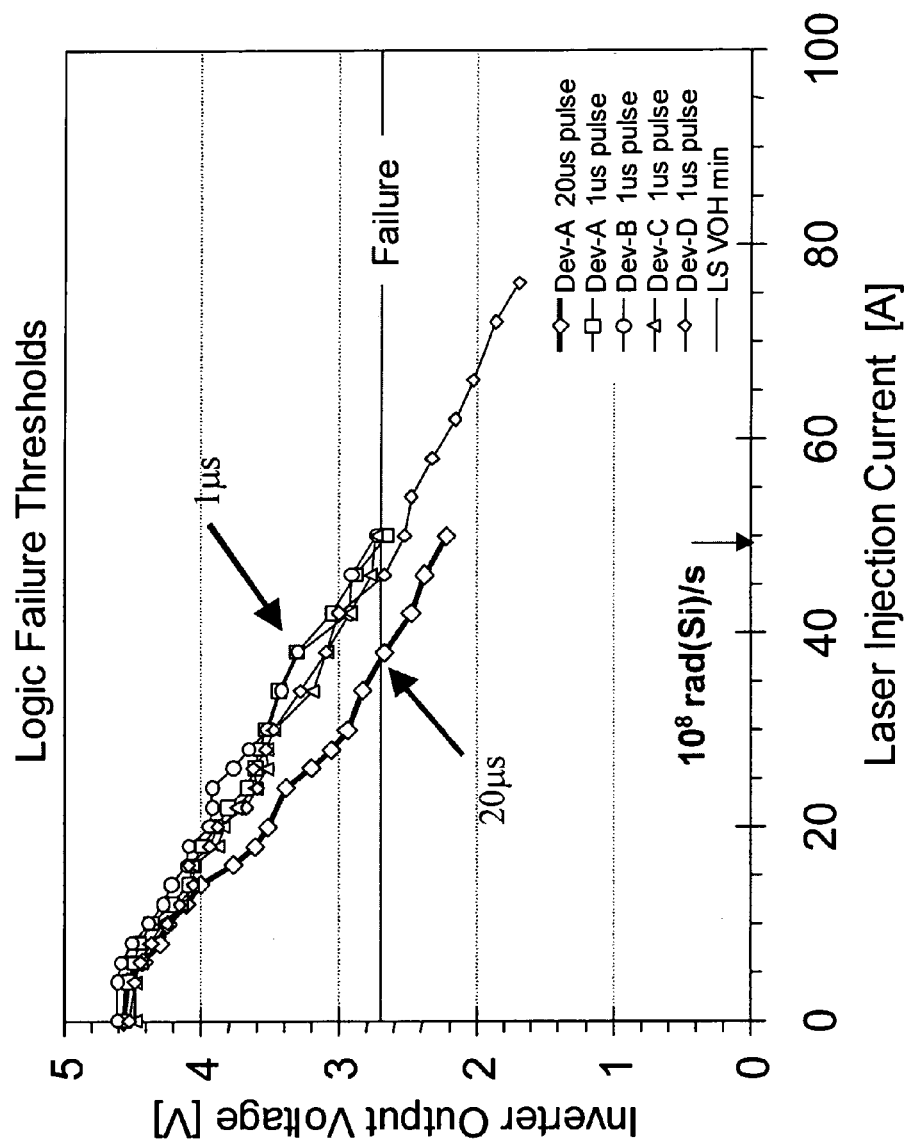
FIG. 10 shows the pulse width-dependence of the logic failure of the aged devices as measured with the broad-beam laser dose-rate apparatus.

In FIG. 10 is shown an example of the pulse width-dependence of a device's failure. The device failure threshold depends on both the magnitude and the duration of the dose-rate pulse. In this example, the pulse magnitude was kept constant and only the pulse width was varied. The wider, 20-µs-duration laser pulse, produced failure in the test device at a lower effective dose-rate than the narrower, 1-µs-pulsewidth.

Hostile Environment Simulator

Figure 11:
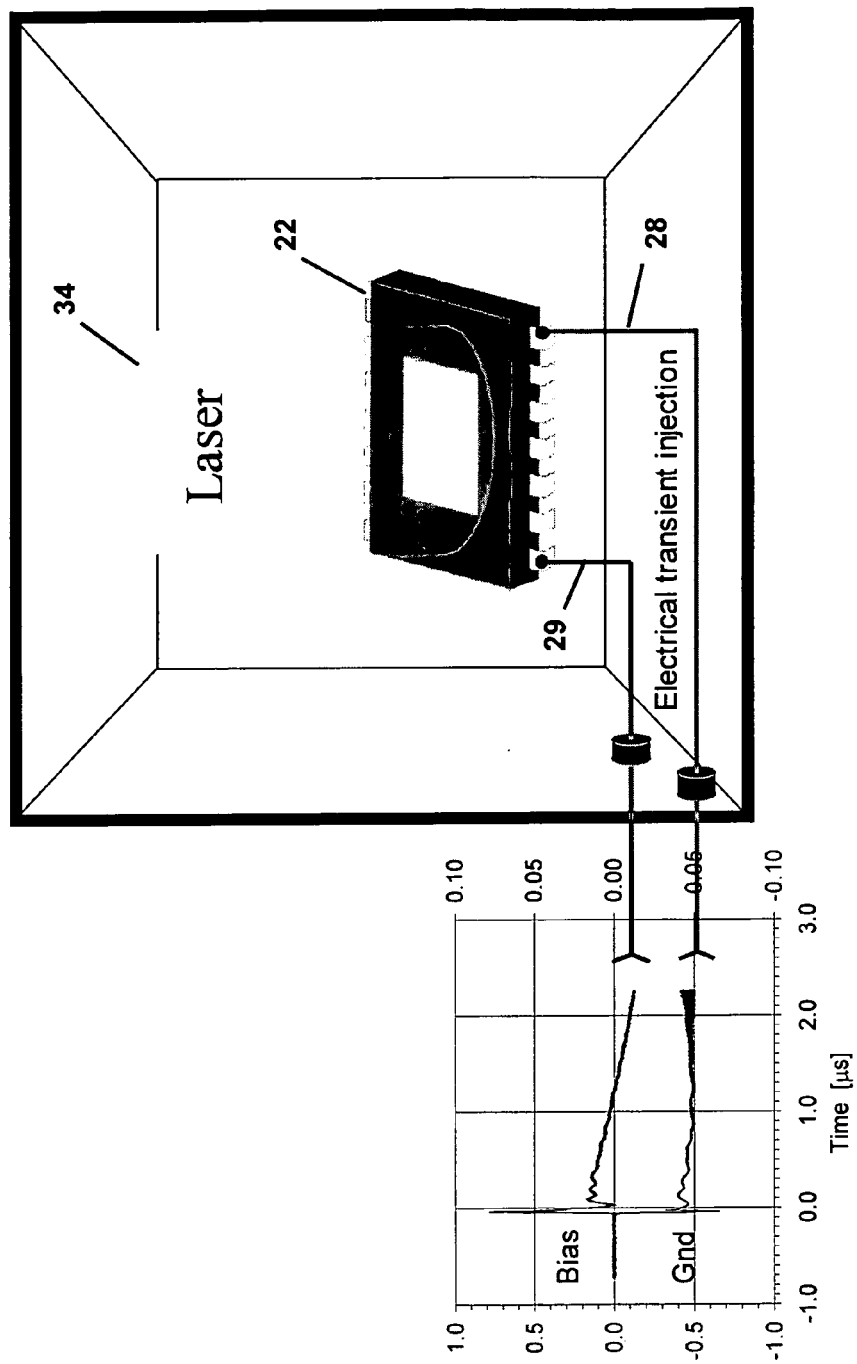
FIG. 11 shows a schematic illustration of an apparatus to provide a time-varying, intensity-varying, dose-rate equivalent exposure of a DUT in synchronization with the injection of ground plane and power line transients.

The broad-beam laser irradiation apparatus 30 can be used to mimic a time-varying, intensity-varying, dose-rate equivalent exposure of a DUT that is embedded in a larger circuit or circuit fragment. The fidelity for hostile environment simulation can be further enhanced by synchronizing the injection of electrical transients into the ground line and power line of the DUT. These transients, measured at x-ray or electron exposure facilities, can thereby represent the response of other, irradiated portions of the surrounding circuit components. The use of traditional x-ray or electron exposure facilities can be used to determine the electrical transient produced by devices that are not amenable to laser testing (e.g., carbon resistors, ceramic capacitors, and other non-silicon devices). The time-varying intensity of the dose-rate laser exposure can be controlled by both the firing sequencing of the four different laser diode arrays and by modulating the injection current into each laser diode array while it is firing. The modulations are controlled using programmable arbitrary waveform generators. In FIG. 11 is shown a schematic illustration of a combined laser dose rate-equivalent exposure 34 occurring in synchronization with the injection of pre-determined electrical transients into the ground and power lines 28 and 29 of the DUT 22.

The present invention has been described as a laser-based apparatus and method to measure and image charge collection in semiconductor devices in response to pulsed laser irradiation. It will be understood that the above description is merely illustrative of the applications of the principles of the present invention, the scope of which is to be determined by the claims viewed in light of the specification. Other variants and modifications of the invention will be apparent to those of skill in the art.

I claim:

1. A focused laser irradiation apparatus for imaging the dose rate response of a semiconductor device, comprising:
   a laser providing a beam of laser light of a wavelength,
   means for focusing the laser beam to a focal spot on the surface of the semiconductor device,
   means for scanning the focused laser beam at a plurality of spatial locations on the surface of the semiconductor device,
   means for pulsing the focused laser beam to provide a laser light pulse having a pulse width at each of the spatial locations on the surface of the semiconductor device to provide a charge collection signal at each of the spatial locations, and
   means for processing the charge collection signal from each of the spatial locations to provide a dose-rate response image of semiconductor device.

2. The focused laser irradiation apparatus of claim 1, wherein the laser comprises an infrared laser diode.

3. The focused laser irradiation apparatus of claim 1, wherein the wavelength of the laser light is about 1064 nanometers or less.

4. The focused laser irradiation apparatus of claim 1, wherein the wavelength of the laser light is about 904 nanometers or less.

5. The focused laser irradiation apparatus of claim 1, wherein the pulse width of the laser light is less than 10 microseconds.

6. The focused laser irradiation apparatus of claim 1, wherein the pulse width of the laser light is less than 100 nanoseconds.

7. The focused laser irradiation apparatus of claim 1, wherein the spot size of the focused laser beam is less than 10 microns in diameter.

8. The focused laser irradiation apparatus of claim 1, wherein the semiconductor device comprises a silicon integrated circuit.

9. The focused laser irradiation apparatus of claim 1, wherein the processing means comprises:
   at least one amplifier for measuring the charge collection signal from the semiconductor device in response to each focused laser beam pulse at each spatial location,
   at least one digital-to-analog converter for providing a digital output corresponding to the magnitude of the measured charge collection signal at each spatial location,
   a computer for combining the digital outputs from each of the plurality of spatial locations to provide the dose rate response image of the semiconductor device.

10. The focused laser irradiation apparatus of claim 1, further comprising means for measuring the time delay between the laser light pulse and the charge collection signal at each spatial location.

11. The focused laser irradiation apparatus of claim 10, wherein the measuring means comprises:
   means for detecting the trigger signal to the pulsing means to provide a trigger signal pulse,
   a constant fraction discriminator for detecting the charge collection signal to provide a charge collection signal pulse, and
   a time-to-amplitude converter to convert the time delay between the trigger signal pulse and the charge collection signal pulse to provide an output pulse with amplitude proportional to the time delay.

12. The focused laser irradiation apparatus of claim 10, further comprising a computer for combining the time delay measurements from each of the plurality of spatial locations to provide a time-delay image of the dose-rate response of the semiconductor device.

13. A method for dose-rate response imaging of a semiconductor device, comprising:
   exposing each spatial location of a plurality of spatial locations on the surface of the semiconductor device to a pulse of laser light from a focused laser beam to provide a charge collection signal at each spatial location, and
   processing the charge collection signal from each of the spatial locations to provide a dose-rate response image of the semiconductor device.

14. A method for monitoring the aging of a semiconductor device, comprising:
- imaging the charge collected at a first time by the active regions of the semiconductor device from exposure to a laser light pulse from a focused laser beam at each spatial location of a plurality of spatial locations on the surface of the semiconductor device to provide a first dose-rate response image,
- imaging the charge collected at a second time by the active regions of the semiconductor device from exposure to a laser light pulse from the focused laser beam at each of the spatial locations on the surface of the semiconductor device to provide a second dose-rate response image, and
- comparing the second dose-rate response image to the first dose-rate response image.

15. The method of claim 14, further comprising detecting from the comparing at least one spatial location of the plurality of spatial locations wherein the second dose-rate response image has changed from the first dose-rate response image.

16. The method of claim 15, further comprising analyzing the materials of the semiconductor device at the at least one spatial location to determine the physical cause of the changed dose-rate response image.

17. A method for time-delay imaging of the dose-rate response of a semiconductor device, comprising;
- exposing each spatial location of a plurality of spatial locations on the surface of the semiconductor device to a laser light pulse from a focused laser beam to provide a charge collection signal, and
- measuring the time delay of the charge collection signal from each of the spatial locations to provide a time-delay image of the dose-rate response of the semiconductor device.

18. A method for monitoring the aging of a semiconductor device, comprising:
- measuring the time-delay image of the dose-rate response of the semiconductor device at a first time,
- measuring the time-delay image of the dose-rate response of the semiconductor device at a second time, and
- comparing the time-delay image measured at the second time to time-delay image measured at the first time.

19. A method for determining the thickness of a thin film layer over the active region of a semiconductor device, comprising:
- exposing each spatial location of a plurality of spatial locations on the surface the thin film layer to a laser light pulse from a focused laser beam to provide a charge collection signal at each spatial location, and
- processing the charge collection signal from each of the spatial locations to provide a dose-rate response image of the semiconductor device resulting from the laser light pulse that passes through the thin film layer.

20. The method of claim 19, further comprising determining the processed charge collection signals at each of the spatial locations to identify at least one thickness anomaly in the thin film.

* * * * *